(12) United States Patent
Yamaguchi et al.

(10) Patent No.: US 6,501,095 B2
(45) Date of Patent: Dec. 31, 2002

(54) THIN FILM TRANSISTOR

(75) Inventors: Shinya Yamaguchi, Mitaka (JP); Mutsuko Hatano, Kokubunji (JP); Takeo Shiba, Kodaira (JP); Yoshinobu Kimura, Tokyo (JP); Seong-Kee Park, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/791,827

(22) Filed: Feb. 26, 2001

(65) Prior Publication Data
US 2002/0100909 A1 Aug. 1, 2002

(30) Foreign Application Priority Data
Jan. 26, 2001 (JP) ......................... 2001-019026

(51) Int. Cl.⁷ .................. H01L 29/04; H01L 31/036

(52) U.S. Cl. .......................... 257/57; 257/59

(58) Field of Search .............. 257/57, 59, 44, 257/45

(56) References Cited

U.S. PATENT DOCUMENTS 6,172,380 B1 * 1/2001 Noguchi et al.

\* cited by examiner

Primary Examiner—Stephen D. Meier
(74) Attorney, Agent, or Firm—Antonelli, Terry, Stout & Kraus, LLP (57) ABSTRACT

The present invention relates to a thin film transistor device, an object of the invention is to realize the thin film transistor device of high mobility by large-grain sizing (quasi single crystal) a low-temperature poly-Si thin film being an elemental material of the thin film transistor in a state trued up to a crystal orientation having the most stable lattice structure in consideration of strain at the interface with a substrate, and by controlling a crystal position.

The object described above can be achieved by realizing a high mobility thin film transistor device in a manner forming a channel with crystal grains having large grain size and controlled crystal orientations by paying attention to a fact that a {110} surface of IV group crystal (crystal composed of either one or a mixed crystal of them selected from a group of C, Si, Ge, Sn, and Pb) has the smallest dangling bond density, by minimizing strain energy at the substrate interface, and by making crystal growth with selection of crystal orientations having growth lengths equivalent to channel lengths.

4 Claims, 12 Drawing Sheets

Fig. 13 dangling bond density n=0.136/A²    n=0.059/A²    n=0.078/A²

Fig. 14

THIN FILM TRANSISTOR

BACKGROUND OF THE INVENTION

Field of the Invention

The present invention relates to a thin film transistor device.

Mainly high-temperature poly-Si has been used for a base thin film being employed for forming a thin film transistor (TFT: Abbreviation of Thin Film Transistor) used conventionally for the thin film transistor device, mainly for an image display device.

This means that poly-crystalline Si is formed on a quartz substrate being an insulator substrate by a high-temperature annealing process at temperature of below or above 900° C., and that the poly-crystalline Si of comparatively large grain size (500–600 nm) is formed. A TFT formed on this high-temperature poly-Si thin film utilizes a Si thin film having a low density in grain boundary thereof and excellent crystallinity, as a channel, field effect mobility of electron of the TFT of 100–150 [$cm^2$/Vs] which is a value close to that (~500 [$cm^2$/Vs], S. M. Sze, Physics of Semiconductor Devices, P. 29, Second Edition, Wiley) of single crystalline Si, can be obtained.

However, the high-temperature poly-Si thin film is necessitated to use an expensive quartz substrate capable of withstanding a high temperature process as the insulator substrate, since this cost of substrate has been the main cause of difficulty in a cost reduction of entire device, generalization of use of the TFT has been restricted.

Of late, in place of the high-temperature poly-Si thin film, research in a low-temperature poly-Si thin film has actively been carried out. This is a poly-crystalline Si thin film crystallized an amorphous Si thin film formed on a low cost glass substrate or a plastic substrate by a plasma CVD method or the like utilizing a zone melting recrystallization method such as excimer laser annealing.

With the use of this method, since the poly-crystalline Si thin film is capable of being formed at low temperature (~150° C.), there is an advantage that remarkably inexpensive TFT can be formed. However, compared with the high-temperature poly-Si thin film, the low-temperature poly-Si thin film can form only the poly-crystalline Si thin film with small grain size and a random crystal orientation.

Since when crystal grain size is small, a density in a grain boundary thereof existing in a current path becomes large, or when a crystal orientation is random, a trapping state density in grain boundary becomes relatively large, in both cases any way, characteristics of a transistor are worsend.

Owing to this, in a TFT as a product, using a conventional low-temperature poly-Si thin film as an elemental material, field effect mobility thereof is restricted to an extent up to 150[$cm^2$/Vs]. With such small mobility, since an element cannot reach speed practically necessitated, there is such a drawback that sorts of element to be formed on the same glass (or plastic) substrate are restricted.

For example, such an inconvenience is generated that in a case of an image display device, a pixel matrix can be formed on a glass (or plastic) substrate, whereas the circuits such as a source driver, a gate driver, a shift register, a peripheral controller are formed on a conventional printed circuit board, the former must be connected to the board with a cable terminal. With such a method, there has been such drawbacks as that in addition to smallness (4 in.–10 in.) in screen size, an increase in cost of entire device are brought about.

In order to improve drawbacks as described above, arts for an increase in crystal grain size and for truing up a position of crystal grain and a crystal orientation are necessitated. So far, various arts has been proposed in order to form a low-temperature poly-Si thin film into large sizing and for controlling a position and a crystal orientation of crystal grain.

An art for forming poly-crystalline Si thin film having a [111] axis in a current moving direction by introducing a metal element for selectively promoting an amorphous Si-thin film formed on the insulated substrate for crystallization and by carrying out crystal growth in a direction parallel to the substrate (for example, Japanese Unexamined Patent Publication H 7-321339), an art for forming rectangular-shaped poly-crystalline Si thin film having a <100> axis in a direction perpendicular to the substrate and a {220} surface in parallel (or 45° C.) to a beam scanning direction by controlling a shape of laser beam for annealing and a scanning rate of annealing position (for example, Japanese Unexamined Patent Publication H 10-41234), and an art for forming a columnar poly-crystalline Si layer trued up a crystal orientation by forming a first poly-crystalline Si layer on a substrate, forming a seed crystal having any one of typical orientation ({100}, {110}, {111}) by an anisotropic etching, and by forming a second polycrystalline Si layer thereon (for example, Japanese Unexamined Patent Publication H 8-55808) and the like. However, in spite of these numerous trials, a TFT having sufficient high mobility has not so far be realized.

SUMMARY OF THE INVENTION

In the crystallization method described above, either of them is not a sufficiently completed art, the maximum grain size which can be achieved has been about 2 μm, and the size is not enough. With this value of 2 μm, it is far behind the practical size of about 8 μm of a thin film transistor required for a liquid crystal display panel of large screen, further, dispersion of characteristics between elements due to positional deviation of crystal grains cannot be restrained.

Thereby, with such arts described above, it is not possible to construct a thin film transistor device that can entirely replace the existing thin film transistor device of a low function. This is because these arts can not realize the most stable lattice structure in a Si crystal when it is brought into contact with a substrate, it is an essential limit to be determined by a strain at the interface between Si and a substrate, and not to be depended on a deposition method of thin film or an annealing method.

Accordingly, in order to realize an image displayed device with the high performance and the large area at low cost, an object of the present invention is to realize a TFT having high mobility by providing such arts as that low-temperature poly-Si thin film becoming an elemental material of TFT can be large sized (quasi single-crystal) in a trued up state to a crystal orientation having the most stable lattice structure in consideration of a strain at the interface with the substrate, and that the positions of crystal of the low-temperature poly-Si thin film can be controlled.

In order to achieve the object described above, researchers of a thin film transistor device of the present invention paid attention to a fact that a {110} surface of a crystal composed of either one or their mixed crystal selected from a group of C, Si, Ge, Sn and Pb which are IV group crystal is the surface having smallest dangling bond density, and a high mobility TFT is realized by minimizing strain energy at the substrate interface, and by forming a channel with a crystal grain of large grain size and of controlled crystal orientation obtained through crystal growth by selecting crystal orientation having a growth length equivalent to a channel length.

Hereinafter, characteristic items of a thin film transistor device of the present invention will be specifically enumerated.

(1) This is a thin film transistor device having a insulator substrate, a poly-crystalline thin film formed on the insulated substrate, and a transistor composed of a source, a drain, a channel and a gate formed on the poly-crystalline thin film, and is characterized in that the poly-crystalline thin film is formed from a crystal composed of either one crystal or their mixed crystals selected from a group of C, Si, Ge, Sn and Pb being a IV group crystal, and is formed from one piece or a plurality of pieces of crystal grains having a <110> axis at an angle of 0–5° relative to a direction perpendicular to the substrate, and a <100> axis at an angle of 0–30° relative to path direction is/are ranged along on at least one path connecting the source and the drain described above.

(2) This is thin film transistor device having a insulator substrate, a poly-crystalline thin film formed on the insulated substrate, and a transistor composed of a source, a drain, a channel and a gate formed on the poly-crystalline thin film, and is characterized in that the poly-crystalline thin film is formed from a crystal composed of either one crystal or their mixed crystals selected from a group of C, Si, Ge, Sn and Pb being a IV group crystal, and a plurality pieces of crystal grains having <110> axes at an angle of 0–5° relative to a direction perpendicular to the substrate are ranged along and that mutual <100> axes of the crystal grains ranged along described above are of uniform value at an angle 0–10°.

(3) In (1) or (2) described above, the poly-crystalline thin film is characterized in that it is, in particular, a Si thin film, a film thickness thereof is 10 nm–100 nm, and a width of a section in a {100} surface of the crystal grain is, in particular, 300 nm–5 μm.

(4) In (1) or (2), the poly-crystalline thin film is characterized in that it is, in particular, a Si thin film, a film thickness thereof is 10 nm–100 nm, a width of a section in {100} surface of the crystal grain is, in particular, 300 nm–5 μm, and widths among a plurality pieces of crystal grains are substantially of uniform value with one another.

(5) In (1) or (2), the poly-crystalline thin film is characterized in that it is, in particular, a Si thin film, a film thickness thereof is 10 nm–100 nm, a width of a section in {100} surface of the crystal grain is, in particular, 300 nm–5 μm, and widths among a plurality pieces of crystal grains are substantially of uniform value with one another.

(6) In (1) or (2), in either or both of the sources and the drains it is characterized in that a part of the sources (or drains) or in the neighborhood thereof has a micro-crystalline region, an average grain size of the micro-crystalline region is smaller than an average grain size of crystal grains in the channel region, and a crystal orientation thereof is more random orientation than the crystal grain in the channel region described above.

(7) In (1) or (2), it is characterized in that in the neighborhood of side parts in one or both of a channel has/have a micro-crystalline area, average grain size of the micro-crystalline region is smaller than average grain size of a crystal grain in channel region, and crystal orientation thereof is more random orientation than the crystal grain in the channel region.

(8) In (1) or (2), it is characterized in that in the neighborhood of side parts in one or both of the source and the drain has/have a micro-crystalline region, average grain size of the micro-crystalline region is smaller than average grain size of a crystal grain in channel region, and crystal orientation thereof is more random orientation than the crystal grain in the channel region.

(9) This is a thin film transistor device having a insulator substrate, a poly-crystalline thin film formed on the insulated board, and a transistor composed of a source, a drain, a channel and a gate formed on the poly-crystalline thin film, and is characterized in that the poly-crystalline thin film is formed from a crystal composed of either one crystal or their mixed crystals selected from a group of C, Si, Ge, Sn and Pb being a IV group crystal, the channel is formed from only one crystal grain, the crystal grain has a <110> axis at an angle of 0–5° relative to a direction perpendicular to the substrate.

(10) This is a thin film transistor device having a insulator substrate, a poly-crystalline thin film formed on the insulated board, a transistor composed of a source, a drain, a channel and a gate formed on the poly-crystalline thin film, and a circuit having a plurality of transistors integrated thereon, the device is characterized in that when size of transistor in a direction of channel length is set L, size of the transistor in a direction of channel width is set W, the poly-crystalline thin film has micro-crystalline region in at least one direction with an interval of L (or W) times any integer number, an average grain size of the crystal grain in the micro-crystalline region is smaller than an average grain size of the crystal grain in the channel part.

(11) The transistor device as set forth in (1) or (2) is characterized in that a plurality of pieces of them are combined and formed on the same substrate.

According to the present invention having characteristics described above, a TFT with high mobility can be realized in such manners as that strain energy at the substrate interface is minimized by utilizing a {110} surface having smallest dangling bond density of a IV group crystal (crystal composed of either one crystal or mixed crystals of them selected from a group of C, Si, Ge, Sn, and Pb) for joining it with the substrate interface, further a crystal growth can be performed by selecting a crystal orientation having a growth length equivalent to the channel length, and that the channel can be formed by the crystal grain of large grain size and crystal orientation controlled.

As a result, since pixel matrices and peripheral circuits are capable of being intensively formed on the same glass substrate, an image display device of large area (for example 15 inches or more) can be highly integrated.

DETAILED DESCRIPTION OF THE PREFERRED EMBODIMENTS

Hereinafter, the present invention will be explained in detail with reference to FIGS. 11–FIG. 14.

First, a crystal orientation dependency of a crystal growth rate and interfacial energy with a substrate will be explained. In the meantime, in the present specification, a crystallographically equivalent crystal orientation group such as crystal orientations (110), (101), (011) are summarized and are noted as {110}. Further, a crystallographically equivalent crystal axis orientation group such as crystal axis orientations [110], [101], [011] are summarized and are noted as <110>.

Further, in order to make explanation simple, here, hereinafter, the explanation of a crystal will be carried out by selecting Si as a representative example, it needs scarcely be said that completely similar phenomena are established to entire IV group crystals (crystal composed of either of or mixed crystals of C, Si, Ge, Sn, and Pb).

Figure 11:
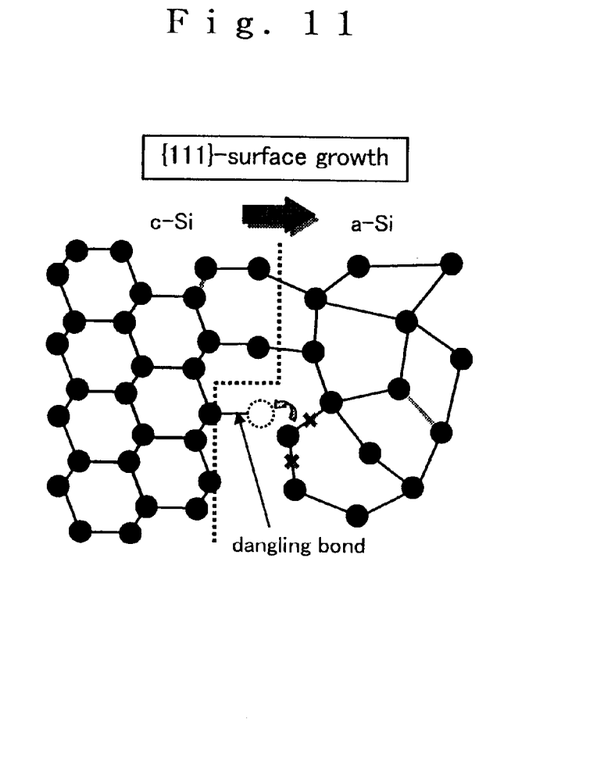
FIG. 11 shows a view illustrating a silicon crystal lattice in a growth process, there are a {100} surface in parallel with a paper sheet surface and a {111} surface in perpendicular to a paper sheet surface, and the figure draws an appearance in growth of the {111} surface toward in a right hand direction of a paper sheet surface.

FIG. 11 shows a view illustrating a silicon crystal lattice in a growth process, there are a {100} surface in parallel with a paper sheet surface and a {111} surface in perpendicular to a paper sheet surface, and the figure draws an appearance growing the {111} surface toward in a right hand direction of a paper sheet surface. In FIG. 11, a left hand side thereof from a dotted line drawn in a central part corresponds to a crystallized c-Si, a right hand side thereof corresponds to an amorphous a-Si which is not yet crystallized.

In the FIG. 11, a portion illustrated as a dangling bond is the portion which is in a state there is no partner of covalent bond out of a Si-bond. At a tip of dangling bond, a substitution site in which, next, a Si atom can enter is existed as illustrated in a round dotted line in the figure. A crystal growth advances by successively repeating entering in this substitution site the Si atom in the neighborhood of the substitution site by cutting an amorphous Si-bond (in figure, illustrated by two X marks).

Figure 12:
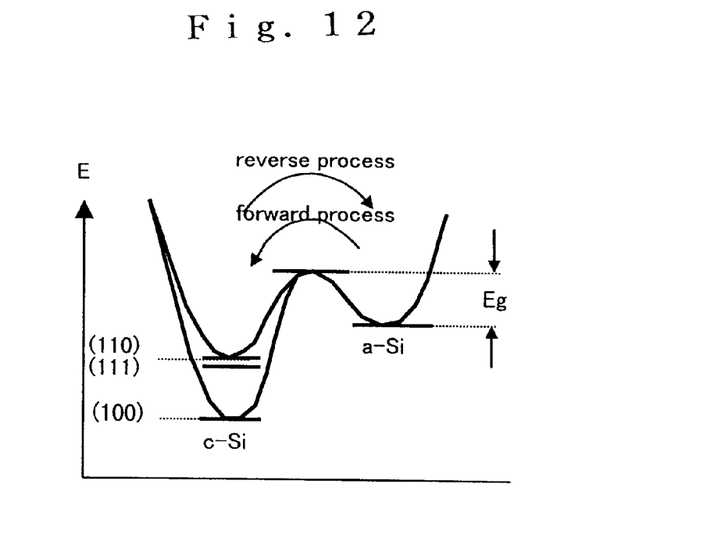
FIG. 12 shows a view typically draws energy of crystal growth.

FIG. 12 shows a view typically draws energy of crystal growth, ordinate shows free energy, abscissa shows a degree of randomness. In order to move from an amorphous a-Si state to a crystal c-Si state, the Si atom must jump over an energy gap Eg resides in a middle. An energy gap Eg is equivalent to the energy required for moving to a position of substitution site by cutting the amorphous Si-bond in FIG. 11.

When the Si atom moves into c-Si region by jumping over the energy gap Eg, the atom enter into an energy state determined according to a crystal orientation. The reason why energy of c-Si depends on the crystal orientation is because the number of dangling bonds in FIG. 11 are different from one another by respective crystal orientation. For example, in a case of {111} surface growth, one piece of dangling bond and three pieces of dangling bonds are alternately appeared on a growth surface for every one layer of growing atomic layers. In a case of {110} surface growth, the appearance of the dangling bond is similar to that.

In case of {100} surface growth, the number of the dangling bonds are always 2 pieces independent of an atomic layer. Stability of a Si-atom arrived to a position of substitution site, the more the number of the dangling bond, the more increase the stability, on the contrary, in the case of just one piece of dangling bond, remarkably reduces the stability. Therefore in case of {111} surface growth, or a {110} surface growth, since a case of just one piece of dangling bond can happens, a reverse process becomes pre-dominant in a manner as that a Si-atom arrived to a position of a substitution site again cuts the bond to become lattice randomness, as a result, an energy state in c-Si becomes unstable.

To summaries a forward process and a reverse process of crystallization like this, as a result, a {100} surface growth has the most fastest growth rate. Also quantitative measurement of the growth rate is remarkably difficult, a {100} surface growth rate (in case of laser anneal) known so far is about 7 m/s. On the contrary, in the {111} surface growth, the growth rate is smaller than that of the {100} surface growth rate about one digit. According to this, please refer to a document, Laser Annealing of Semiconductors, J. M. Poate, Academic Press, New York 1982.

The importance of the energy of the Si thin film is not limited to that, but actually an interface between it and a substrate becomes remarkably important factor. When substances having different lattice constants from each other form a interface, essentially strain is generated, however, the interfacial energy differs depends not only on the difference of the lattice constants between both of them but also on the crystal orientation of Si.

Figure 13:
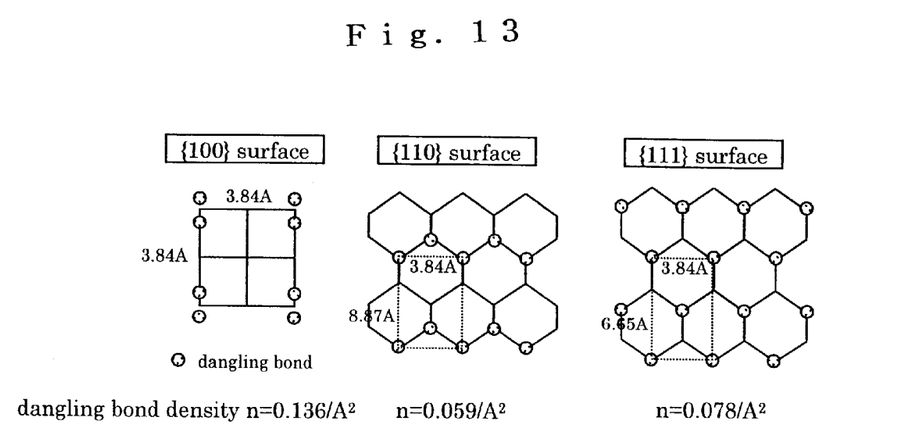
FIG. 13 shows a view illustrating a position of a dangling bond, and illustrating from left to right a {100} surface, a {110} surface, and a {111} surface respectively.

FIG. 13 shows a view illustrating a position of a dangling bond, and illustrating from left to right a {100} surface, a {110} surface, and a {111} surface respectively. Surface densities of these dangling bonds are in descending order of magnitude from the left hand side the {100} surface, the {111} surface, and {110} surface. Since larger the density of the dangling bond the more dense the joint with the substrate, it means that a loss of strain energy is large.

Actually, a difference in interfacial energy due to crystal orientation becomes more and more enormous rather on the interface with the substrate having harder quality with stoichiometric SiO$_2$ composition such as quartz, and at the interface with high molecular and soft substrate such as plastic the difference is comparatively small. In anyway, to form large grain size, it is essential to have a wide interface, and for that, the {110} surface having smallest density of dangling bond is advantageous.

Figure 14:
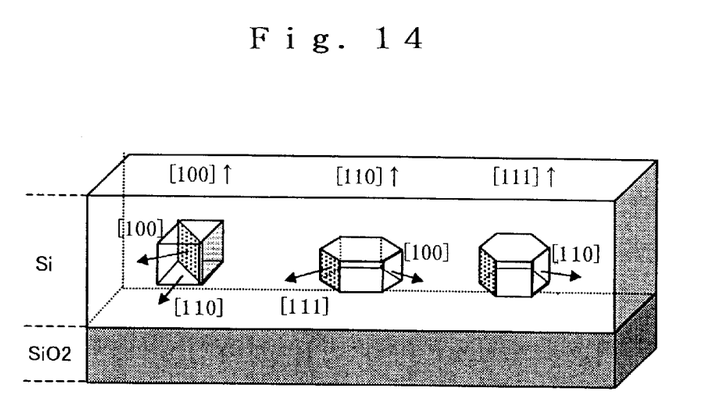
FIG. 14 shows a view drawn typically crystal orientations to which crystal grains can take in a silicon thin film on an insulator board.

FIG. 14 shows a view illustrates typically a crystal orientation to which crystal grains can take in silicon thin film on an insulator board. In FIG. 14, the {100} surface, the {110} surface, and the {111} surface are illustrated in parallel with the substrate from left to right. In order to form a large grain size in the Si thin film, it is necessary to grow these crystal grains largely in lateral directions. For that purpose, the {100} surface growth is indispensable as described above, and in order to have the surface within the film in a lateral direction, it will be understood that having the {100} surface or the {110} surface which are in parallel with the substrate is required.

Further, in consideration of a difference in strain energy at the interface, the most advantage lattice structure to realize the large grain size, is a structure to satisfy both of the {110} surface in parallel with the substrate, and the {100} surface perpendicular relative to a current path.

With this much, explanations about crystal orientation dependence of a crystal growth rate and interfacial energy with the board will be finished. Hereinafter, embodiments of the present invention will be explained.

First Embodiment

Figure 1:
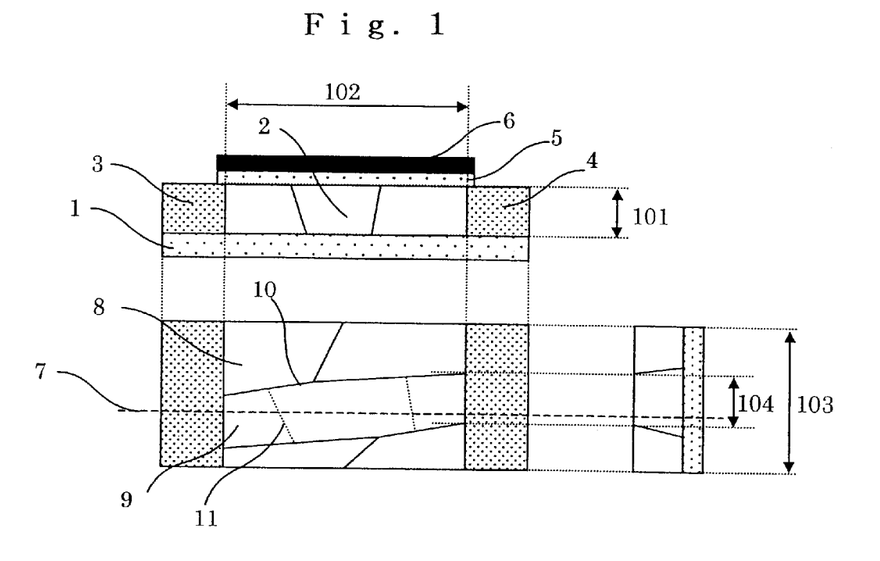
FIG. 1 shows development illustrating a thin film transistor device relating to a first embodiment of the present invention. In the drawing, a figure in an upper stage in FIG. 1 shows a longitudinal sectional view, a figure in an lower stage thereof shows a plan view transversely cross sectioning a channel portion, a figure at a right hand side thereof shows a view drawn the longitudinal sectional view at an angle different by 90° degrees from it, of the thin film transistor device.

FIG. 1 shows development illustrating a thin film transistor device relating to a first embodiment of the present invention. In the drawing, a figure in an upper stage in FIG. 1 shows a longitudinal sectional view, a figure in an lower stage thereof shows a plan view transversely cross sectioning a channel portion, a figure at a right hand side thereof shows a view drawn the longitudinal sectional view at an angle different by 90° from it, of the thin film transistor device. An insulator substrate 1 has a channel 2 thereon composed of a poly-crystalline Si thin film of a film thickness 101. The film thickness 101 is 50 nm in this embodiment.

A source 3 and a drain 4 are formed on the poly-crystalline Si thin film, and a gate insulating film 5 and a gate 6 are formed on a channel 2. Of the channel 2, a region directly below the gate insulating film 5 is, in particular, an active region of a field effect transistor and a current density is the largest. A plan view of the portion is drawn at the lower stage of the FIG. 1, and the present embodiment is characterized in that the grain size and the crystal orientation of the poly-crystalline Si thin film on this plane has a structure described hereinafter.

That means that when thinking of one current path 7 connecting the source 3 and the drain 4, a crystal grain existing along the path is characterized in that it is a {110}-oriented crystal grain 9 having the {110} surface in parallel with the substrate, and the {110} surface of the {110}-oriented crystal grain 9 is perpendicular to the current path 7.

With such a lattice structure, there are advantages that large grain size can be formed by minimizing interfacial energy described above, at the same time, only one or few crystal grain can be formed in a space between the source 3 and the drain 4 by truing up the most growth surface {100} in a direction of a channel length.

With this constitution, scattering acting on a current flowing in the current path 7 can be minimized, and high mobility can be realized. Since the practical channel length 102 of the transistor is about 4 μm, for example in a case where a space between the source 3 and the drain 4 is constituted of single {110}-oriented crystal grain 9, a width of {110}-oriented crystal grain 104 is 300–500 nm from difference in growth rate.

This value is small compared with 4 μm of a channel width 103 of the transistor, however, a current actually flowing is mostly concentrated to the current path 7 so that influence due to difference in the width is small. Further, if there is at least one path like this in a channel, since the present embodiment is effective, the other grain boundary, for example, a crystal grain 8 is a crystal orientation of random orientation, as a result even if there exists a large grain boundary 10 between the crystal grain 8 and the {110}-orientate crystal grain that existence is not objectionable.

Further, even if there exists a twin grain boundary 11 in an interior of the {110}-oriented crystal grain 9, the twin boundary itself scarcely contributes to scattering, the existence is not objectionable at all. It is the characteristics of the present invention that as described above, the channel 2 on the one current path 7 connecting the source 3 and the drain 4 is formed by the {110}-oriented crystal grain 9, and the {110}-oriented crystal grain 9 has a {110} surface in a direction perpendicular to the current path 7.

Second Embodiment

Figure 2:
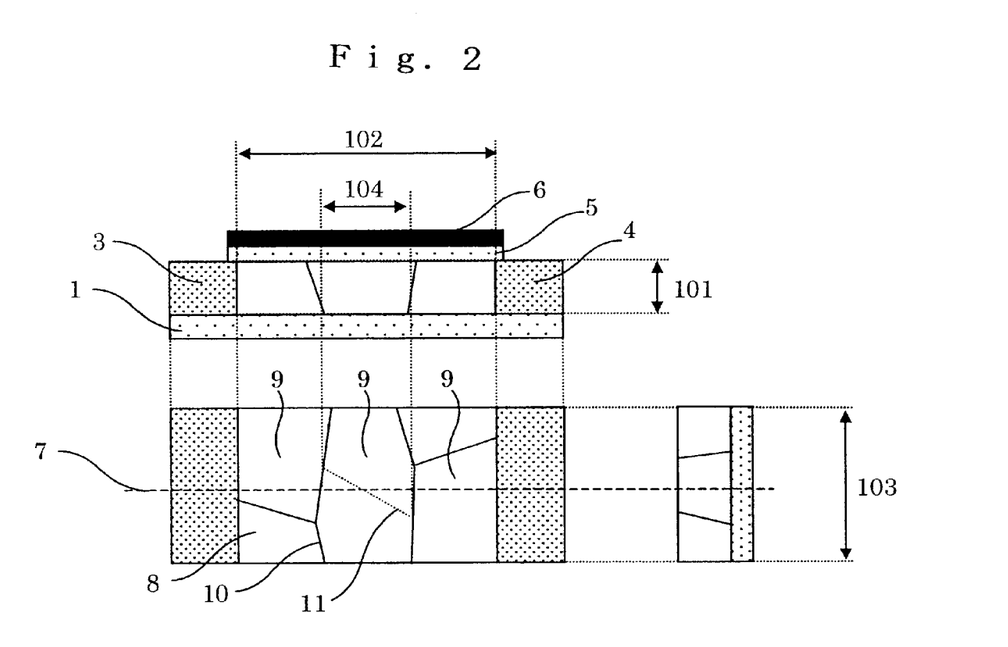
FIG. 2 shows a development illustrating a thin film transistor device relating to a second embodiment of the present invention.

FIG. 2 shows a development illustrating a thin film transistor device relates to a second embodiment of the present invention. Even in the present embodiment, a Si thin film is formed from {110}-oriented crystal strains 9 on an current path 7, different from the first embodiment, it is characterized in that a {100} surface of the {110}-oriented crystal grains 9 is in parallel with the current path 7.

With such a constitution, since a width 104 of the {110}-oriented crystal grain is 300–500 nm, a channel length 102 cannot be formed from a single {110}-oriented crystal grains 9, on the contrary there is an advantage that dispersion of the number of grain boundary 10 crossing the current path 7 can be restrained.

In an actual thin film transistor device, the dispersion between elements is a large drawback together with high mobility, and the dispersion is strongly depended on the dispersion of the number of grain boundary. Therefore, like a method to realize the high mobility with large grain size, a method to realize the medium mobility with medium grain size without dispersion is also very effective.

In the present embodiment, the number of the grain boundaries 10 in the channel length 102 can normally be made constant by making the {110}-oriented crystal grains 9 are ranged along and cross the current path 7. Further, in this time also, the {110}-oriented crystal grains 9 are not objectionable including a twin crystal grain boundaries 11.

Third Embodiment

Figure 3:
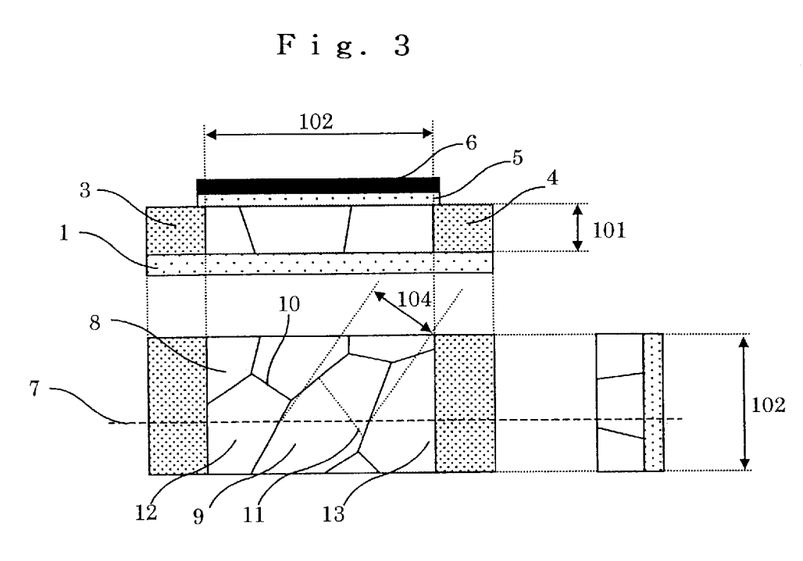
FIG. 3 shows a development illustrating a thin film transistor device relating to a third embodiment of the present invention.

FIG. 3 shows a development illustrating a thin film transistor device relates to a third embodiment of the present invention. Even in the present embodiment, a Si thin film on one current path 7 is formed from {110}-oriented crystal grains 9, 12 and 13, different from the embodiment described above, it is characterized in that a {100}-surface direction within surface of respective {110}-orientation crystal grains 9 is mutually optional.

With such a structure, since the crystal grain boundaries 10 are formed between respective {110}-oriented crystal grains 9, it has draw back that the grain boundaries 10 crossing the current path 7 is surely appeared and lowers the mobility. However, there is an advantage that in a laser annealing process for conducting crystallization as described later, since a complicated process such as seed crystal formation or double laser annealing is not necessitated, a production process can be remarkably simplified, low cost can be realized at the same time while obtaining an advantage of large grain size of the {110}-oriented crystal grains 9.

Fourth Embodiment

Figure 4:
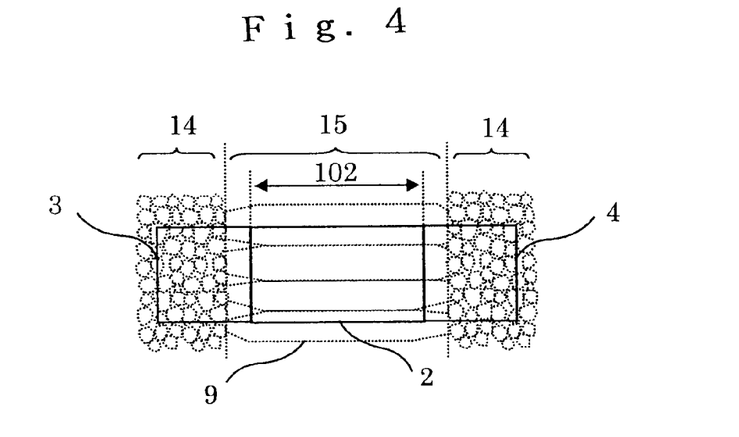
FIG. 4 shows a plan view illustrating a thin film transistor device relating to a fourth embodiment of the present invention. In figure, a channel 2, a source 3, and a drain 4 are drawn with solid lines, and crystal structures of a silicon thin film formed from them are typically drawn with dotted lines.

FIG. 4 shows a plan view illustrating a thin film transistor device relating to a fourth embodiment of the present invention. In FIG. 4, a channel 2, a source 3, and a drain 4 are drawn with solid lines, and crystal structures of a silicon thin film formed out of them are typically drawn with dotted lines.

The present embodiment is similar to the first embodiment in that the channel 2 is composed of a {110}-oriented crystal grain region 15 in which a {110}-oriented crystal grains 9 are ranged along and that a {100} surface of the {110}-oriented crystal grains 9 is a direction perpendicular to a direction of a channel length 102, and is characterized in that micro-crystalline regions 14 are included in a part of the source 3 and the drain 4.

In the micro-crystalline regions 14, average grain size thereof is smaller than the average grain size of the {101}-oriented crystal grains 9 in the channel 2, further, a crystal orientation thereof is more random orientation than the grains 9. Further the micro-crystalline region may be existed in ether one of the source 3 and the drain 4 or may be existed in the neighborhood of exterior rather than an interior of the source 3 and drain 4. In anyway, there are two advantages by providing the micro-crystalline region 14 in the neighborhood of the channel 2.

One of the advantage is in that the {110}-oriented crystal grains 9 of large grain size are facilitated in forming in the channel 2 by being subjected to a heat treatment such as laser annealing by making the micro- crystalline regions 14 as seed crystals, has the other advantages is in that an interfacial strain of the {110}-oriented crystal grains 9 formed is averagedly caused a relaxation, that is, in that a surface roughness in the grain boundary around the {110}-oriented crystal grains 9 can be flattened.

In a crystal growth method such as conventional laser annealing, a volume increase caused at the time of crystallization brings about mutual pushing in the grain boundary, increased volume lost its site out is caused a relaxation in the shape of a surface roughness, thus formed surface roughness has been a cause of a gate leak current. This caused such a vicious circle as that a thick gate oxide film is necessitated for the purpose of avoiding the gate leak current, and that further deteriorates characteristics.

The micro crystalline regions of the present embodiment has an action to restrain the roughness in the grain boundary around the {110}-oriented crystal grains 9 by releasing the volume increase to the outside from the channel 2, as a result, there is an advantage to improve element characteristics.

Fifth Embodiment

Figure 5:
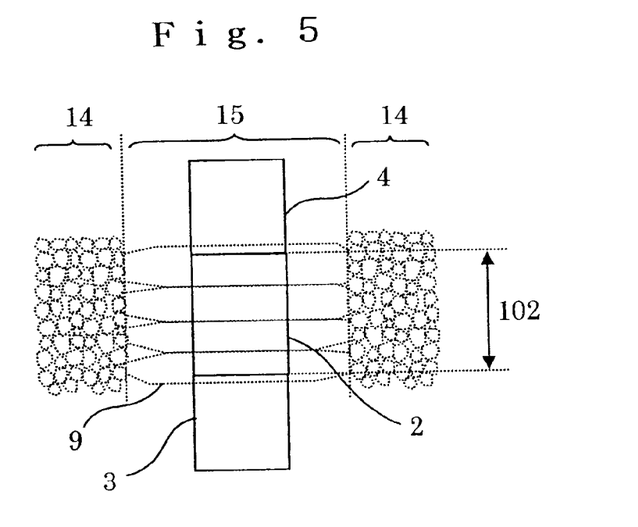
FIG. 5 shows a plan view illustrating a thin film transistor device relating to a fifth embodiment of the present invention.

FIG. 5 shows a plan view illustrating a thin film transistor device relating to a fifth embodiment of the present invention. In the present-embodiment, a channel 2 is composed of a {110}-oriented crystal grain region 15 in which the {110}-oriented crystal grains 9 are ranged along, it is same as a second embodiment 2 in that {100}-surfaces of the {110}-oriented crystal grains 9 are parallel in a direction of a channel length 102, it is characterized in that the channel 2 has a micro-crystalline regions 14 in the neighborhood of one or both side part of the channel 2.

The micro-crystalline regions 14, similar to that of the fourth embodiment, average grain size thereof is smaller than average grain size of the {110}-oriented crystal grains 9, and has crystal orientation more random oriented than that. It is similar to the forth embodiment in that by providing with such micro-crystalline regions 14, the {110}-oriented crystal grain 9 of large grain size is facilitated to be formed by a heat treatment such as laser annealing by making the micro-crystalline regions 14 as seed crystals, and that a surface rashness in the grain boundary around the {110}-oriented crystal grains 9 can be flattened.

Sixth Embodiment

Figure 6:
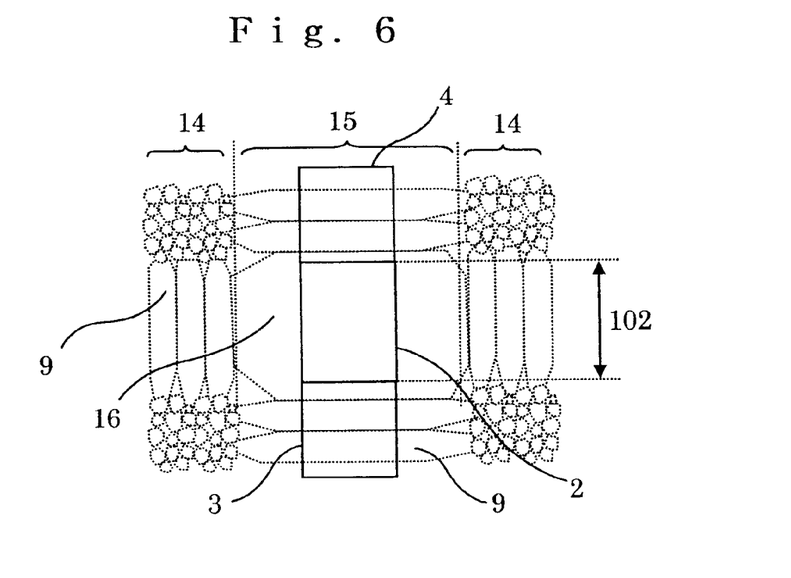
FIG. 6 shows a plan view illustrating a thin film transistor device relating to a sixth embodiment of the present invention.

FIG. 6 shows a plan view illustrating a thin film transistor device relating to a sixth embodiment of the present invention. The present embodiment is characterized in that a channel 2 is composed of a {110}-oriented single crystal grain 16, and that a {110}-oriented crystal grain region 15 and a micro crystalline regions 14 are existed around the {110}-oriented single crystal grain 16.

With such a structure, the {110}-oriented crystal grain region 15 can be formed by making the micro-crystalline regions 14 as seed crystals, and next the {110}-oriented single crystal grain 16 can be formed by methods such as double laser annealing by making the {110}-oriented crystal grain region 15 as a seed. The {110}-oriented single crystal grain 16 is enough to have a {110}-surface in parallel to the substrate, an orientation within the surface is optional.

Further, these micro-crystalline regions 14 or the {111}-oriented crystal grain region 15 may well reside one side of the side parts of the channel 2 or may well reside in the neighborhood of one of a source 3 or a drain 4. There is an advantage, in anyway, that the channel 2 is formed from the {110}-oriented single crystal grain 16 and realize high mobility by providing in the neighborhood of the channel 2 with the micro-crystalline regions 14 and the {110}-oriented crystal grain region 15.

Seventh Embodiment

Figure 7:
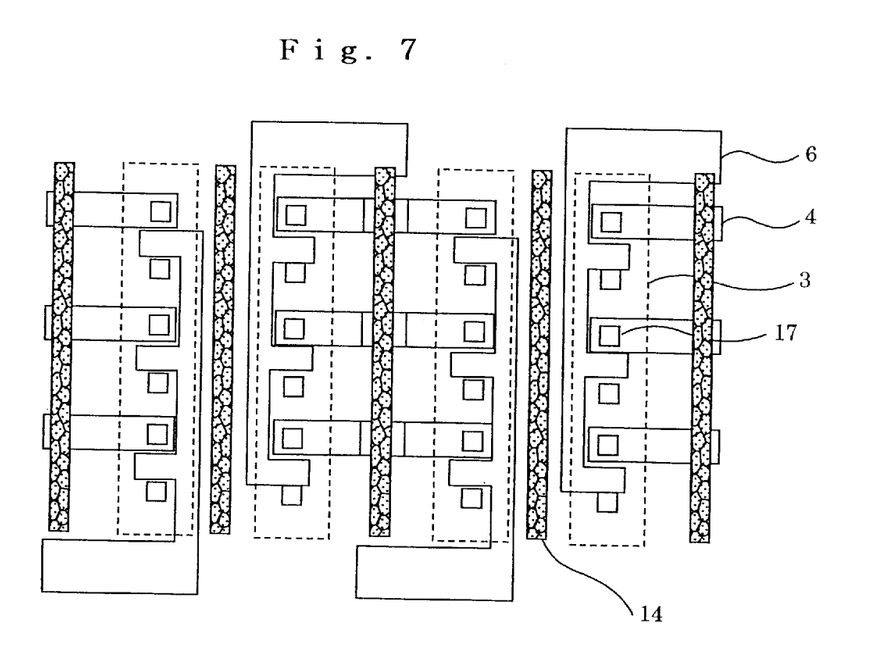
FIG. 7 shows a plan view illustrating an example of forming patterns for a seventh embodiment of the present invention.

FIG. 7 illustrates an example of forming patterns of a peripheral circuit part formed in a Si thin film on a glass substrate utilizing the forth embodiment of the present invention. It is an example incorporated patterns of sources 3 (dotted line), patterns of drains 4 (solid line), and patterns of gates 6 (solid line) in a high integrated degree and respective patterns are connected to a channel layer through contacts 17.

Together with these patterns, patterns of micro-crystalline regions 14 are formed periodically and in blank space portions of other patterns. It need scarcely be said that a channel of respective transistor is formed from (110)-oriented crystal grains. With such a method of formation, advantage of a forth embodiment can be obtained without enlarging formation area of transistors.

Further, periodical micro-crystalline patterns like this has excellent efficiency in a production process of heat treatment method such as laser annealing. That is because, by determining a moving direction of laser beam annealing in a lateral direction of FIG. 7, pulse laser annealing time/a cycle and moving speed of a stage holding a substrate can be adjusted, and periodical micro-crystalline region patterns like these are capable of being formed with a single process. The patterns described above is a part of an examples, and it is possible to have a various pattern shapes having an advantage of the forth embodiment.

Eighth Embodiment

Figure 8:
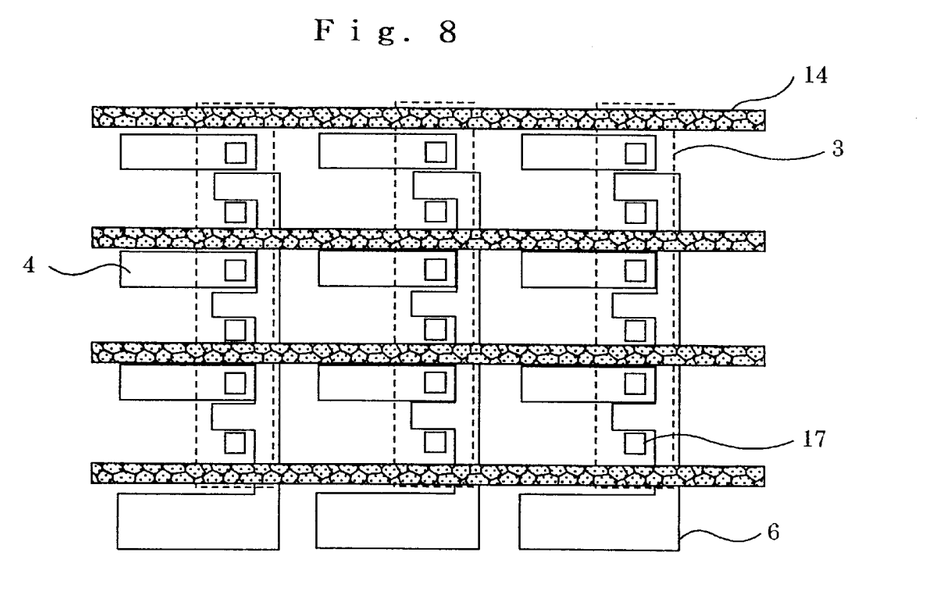
FIG. 8 shows a plan view illustrating an example of forming patterns for an eighth embodiment of the present invention.

FIG. 8 illustrates an example for forming patterns of a peripheral circuit part formed in a Si thin film on a glass substrate utilizing a fifth embodiment of the present invention. Patterns of micro-crystalline regions 14, as illustrated in FIG. 8, are provided at an interval portions of contacts 17 of sources 3 or drains 4. Similar to a seventh embodiment, an advantage of the fifth embodiment can be obtained without enlarging a formation area of transistors.

A channel of respective transistor is formed from a {110}-oriented crystal grain. It is similar to a seventh embodiment in terms of excellent efficiency of a production process of heat treatment method such as laser annealing. In this case, it is enough to set a moving direction of laser annealing to vertically of FIG. 8. The patterns described above is a part of the examples, it is possible to have a various pattern shapes having an advantage of the fifth embodiment.

Ninth Embodiment

Figure 9:
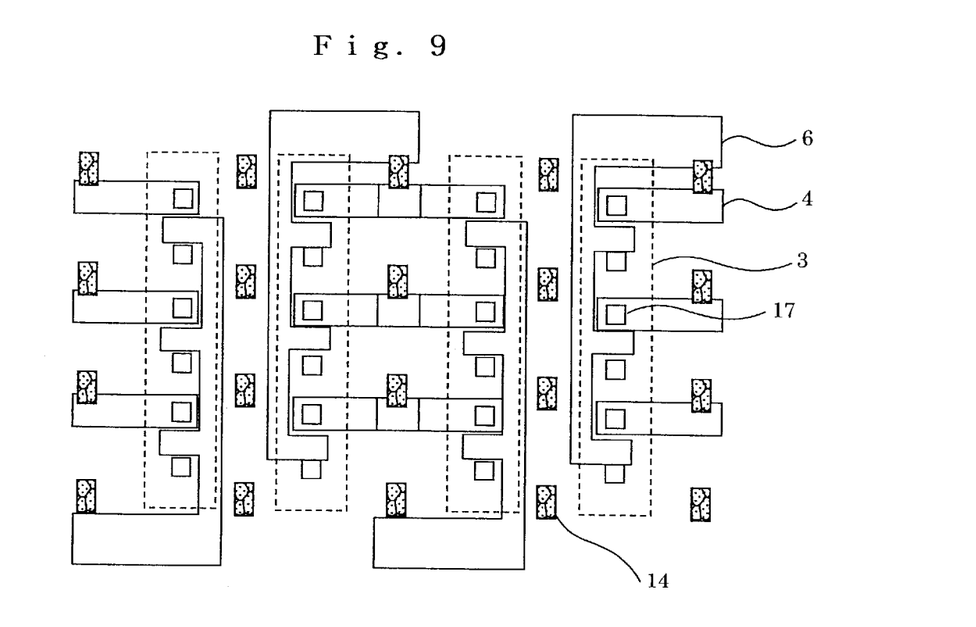
FIG. 9 shows a plan view illustrating an example of forming patterns for a ninth embodiment of the present invention.

FIG. 9 illustrates an example of forming patterns of a peripheral circuit part being formed in a Si thin film on the glass substrate utilizing a sixth embodiment of the present invention. A channel of respective transistor is formed from {110}-oriented single crystal grains, and in the neighborhood thereof are existed {110}-oriented crystal grain regions similar to the six embodiment.

In the case of this embodiment, formation of the patterns can be realized by once setting a moving direction of laser beam annealing in the lateral direction of FIG. 9, forming a structure of a seventh embodiment, next changing the moving direction to a vertical direction of FIG. 9, and by laser annealing one more time. In this case, production cost is increased because of doubling a process, on the contrary, there is advantage that the channel is single crystallized. The patterns described above is a part of the examples, and it is possible to have a various pattern shapes having an advantage of the six embodiments.

Tenth Embodiment

Figure 10:
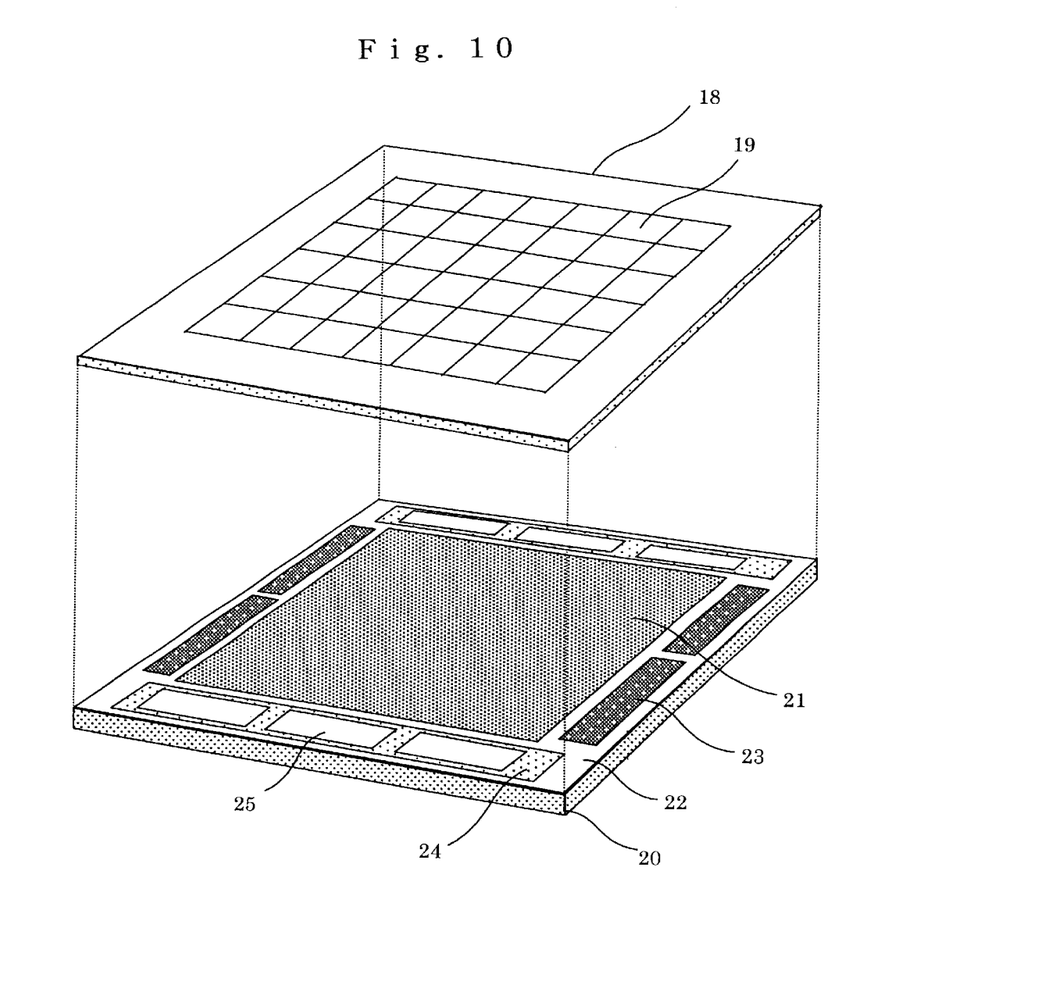
FIG. 10 shows a view illustrating an image display device relates to a tenth embodiment of the present invention.

FIG. 10 illustrated an example of an image display devise utilizing a thin film transistor semiconductor devise (TFT) of the present invention. A Si thin film is formed on a substrate 20, circuits composed of a pixel driver region 21 on the Si thin film, of a buffer amplifier region 22, gate driver regions 23, shift resister regions 24, gate driver regions 25 and the like on the periphery of the Si thin film are integrated, these are integrally formed, and are connected to a an image display panel 18 having pixels 19 and functions.

Since required performances to transistors constituting these circuits are respectively different from each other, a first to third embodiments of the present invention are selectively and complexedly combined with one another and utilized. With such a constitution, main circuit can be integrated on a glass substrate of large area, and an image display device integrated most of conventional peripheral circuit can be formed. Further, there is an advantage that the image display device can be produced with few processes utilizing low cost glass substrates.

What is claimed is:

1. A thin film transistor device in the thin film transistor device comprising:
   (a) an insulator substrate,
   (b) a poly-crystalline thin film formed on said insulator substrate,
   (c) a transistor composed of a source, a drain, a channel, and a gate formed on said poly-crystalline thin film,
      wherein said poly-crystalline thin film is a crystal composed of either one crystal, or a mixed crystal of them selected from a group of C, Si, Ge, Sn, and Pb of IV group, on at least one current path connecting said source with said drain, a crystal grain has a <110> axis including an angle of 0–5° relative to a direction perpendicular to said substrate and a <100> axis including an angle at 0–30° relative to a direction of the current path is ranged along a piece or a plurality of pieces thereof.

2. A thin film transistor device as set forth in claim 1, wherein said poly-crystalline film is a Si thin film, said Si thin film has a film thickness of 10 nm–100 nm and a cross section in a {100} surface of said crystal grain has a width of 300 nm–5 $\mu$m.

3. A thin film transistor device as set forth in claim 1, wherein at least one of said source and said drain, has micro-crystalline regions in a part or in the neighborhood of said source or said drain, average grain size of said micro-crystalline regions is smaller than average grain size of crystal grains in said channel region, and a crystal orientation of said micro-crystalline regions is more random orientation than said crystal grain in said channel region.

4. A thin film transistor device as set forth in claim 1, wherein in the neighborhood of one of or both side part of said channel has/have micro-crystalline regions, average grain size of micro-crystalline regions is smaller than average grain size of crystal grains in said channel region, and a crystal orientation of said micro-crystalline regions is more random orientation than said crystal grain in said channel region.

* * * * *